(12) United States Patent
Bréham et al.

(10) Patent No.: US 11,187,771 B2
(45) Date of Patent: Nov. 30, 2021

(54) MECHANICAL APPARATUS FOR FAST EPR COILS SWITCHING BETWEEN RAPID SCAN AND CW MODES

(71) Applicant: Bruker France SAS, Wissembourg (FR)

(72) Inventors: Sébastien Bréham, Wissembourg (FR); Frédéric Jaspard, Wahlenheim (FR); Eric Beyer, Eberbach-Seltz (FR)

(*) Notice: Subject to any disclaimer, the term of this patent is extended or adjusted under 35 U.S.C. 154(b) by 0 days.

(21) Appl. No.: 17/181,332

(22) Filed: Feb. 22, 2021

(65) Prior Publication Data

US 2021/0278494 A1    Sep. 9, 2021

(30) Foreign Application Priority Data

Mar. 3, 2020  (EP) .................................... 20315032

(51) Int. Cl.
   *G01R 33/60* (2006.01)
   *G01R 33/36* (2006.01)

(52) U.S. Cl.
   CPC ......... *G01R 33/60* (2013.01); *G01R 33/3607* (2013.01)

(58) Field of Classification Search
   None
   See application file for complete search history.

(56) References Cited

U.S. PATENT DOCUMENTS

| | | | |
|---|---|---|---|
| 4,782,296 A | 11/1988 | Schmalbein et al. | |
| 5,345,203 A | 9/1994 | Gentsch et al. | |
| 6,573,720 B1* | 6/2003 | Devasahayam | G01R 33/3415 324/316 |
| 2011/0109313 A1* | 5/2011 | Subramanian | G01R 33/60 324/316 |
| 2012/0262176 A1 | 10/2012 | Baranowski et al. | |
| 2019/0374105 A1* | 12/2019 | Raylman | A61B 6/4417 |

FOREIGN PATENT DOCUMENTS

| | | |
|---|---|---|
| DE | 4125655 A1 | 2/1993 |
| EP | 3339872 B1 | 6/2018 |
| EP | 3764116 A1 | 1/2021 |

OTHER PUBLICATIONS

Tseytlin et al., "Modular imaging system: Rapid scan EPR at 800 MHz", Journal of Magnetic Resonance, Academic Press, Orlando, FL, US, vol. 305, Jun. 2019.
Mitchell et al., "Comparison of continuous wave, spin echo, and rapid scan EPR of irradiated fused quartz", Radiation Measurements, Elsevier, Amsterdam, NL, 2011.

* cited by examiner

*Primary Examiner* — Douglas X Rodriguez
(74) *Attorney, Agent, or Firm* — Benoit & Côté Inc.

(57) ABSTRACT

An electron paramagnetic resonance (EPR) apparatus has a main magnet with two pole pieces on either side of an air gap, and at least one EPR probe head adapted for rapid scan (RS) measurements positioned between the pole pieces of a main magnet, and a pair of RS coils. The EPR apparatus further has at least one EPR probe head adapted for continuous wave (CW) signal measurements, positioned between the pole pieces of the main magnet, and a carrier which allows insertion of the RS coils into the air gap between the pole pieces in an operation position and extraction of the RS coils from the air gap to a storage position outside of a CW operating volume. The system allows a quick and secure change of the RS coils, safely and rapidly, by a single user.

16 Claims, 6 Drawing Sheets

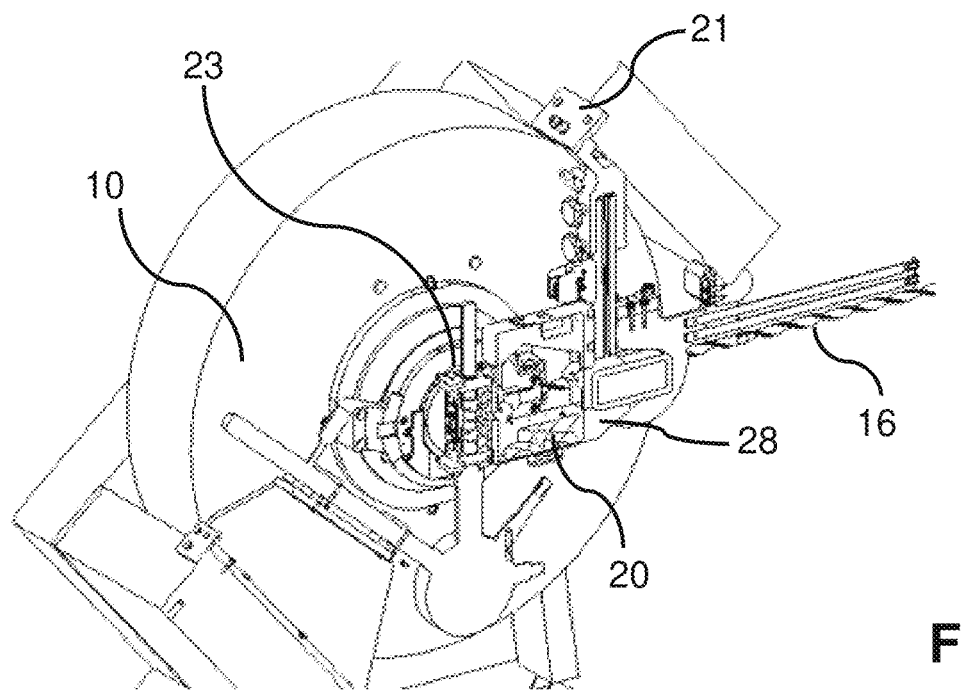
Fig. 6
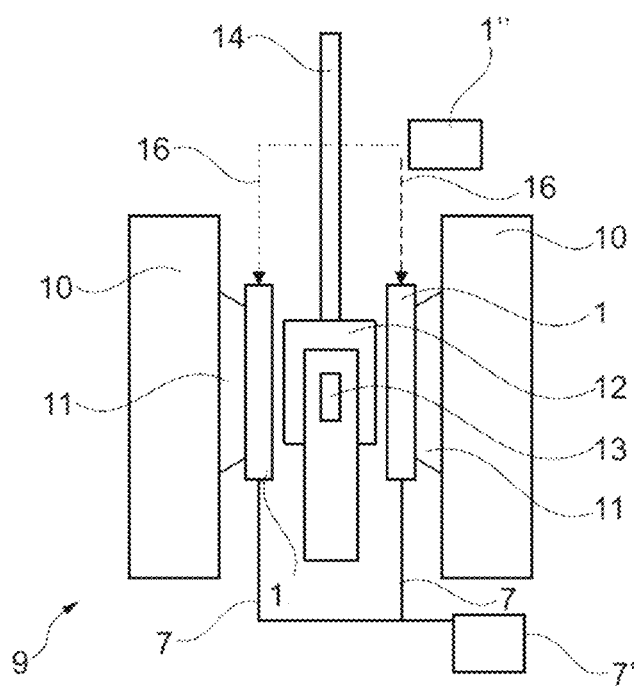
Fig. 7 - Prior Art

MECHANICAL APPARATUS FOR FAST EPR COILS SWITCHING BETWEEN RAPID SCAN AND CW MODES

BACKGROUND OF THE INVENTION

Field of the Invention

The present invention relates to an electron paramagnetic resonance (EPR) apparatus comprising a main magnet with two pole pieces provided on either side of an air gap, at least one EPR probe head adapted for Rapid Scan (RS) measurements, positioned between the pole pieces of the main magnet and a pair of RS coils. By convention, the probe head comprises an EPR resonator, a sample holder and a microwave (MW) guide. A device of this type is described in European patent document EP19315067.9.

Description of the Related Art

The present invention is related to the field of non-invasive and non-destructive analysis and imaging using Electron Paramagnetic Resonance (EPR), in particular so-called Rapid Scan (RS) EPR, and concerns more specifically an EPR apparatus equipped with specific RS coils and corresponding coil devices. RS EPR is an alternative method for recording spectra to Continuous Wave (CW) EPR and pulsed EPR. Electron Spin Resonance spectrometers for CW operation and pulsed operation are described in U.S. Pat. No. 4,782,296. An example of an EPR imaging device using the RS technique is disclosed in U.S. patent document 2012/0262176 A1. Although the apparatus shown there comprises gradient coils for the space-encoding, it can also be used without such coils as an EPR spectrometer.

Standard CW and Rapid Scan EPR spectroscopy methods, either of high or medium or low sensitivity type of implementations (the sensitivity being reflected by the signal to noise ratio of a measured EPR spectrum) require a simultaneous application of static, RF and microwave magnetic fields upon the material (i.e., the EPR sample) under study contained within a microwave cavity. Resonator arrangements for a cylindrical TE01 n microwave mode for use in EPR spectroscopy are described in U.S. Pat. No. 5,345,203. An improved EPR resonator with extended transparency and homogeneity in the RF range is disclosed in U.S. patent document 2018/0172790 A1.

In EP19315067.9, the structure of an RS EPR device is disclosed. The RS-coils need to be placed precisely and reproducibly between the magnets and the microwave resonator. For a CW measurement, the RS-coils need to be removed from this operating position and stored at a position outside the magnetic field of the main magnet such that the RS-coils release an air gap clearance for the CW equipment.

The major challenges to overcome for the relocation of the RS-coils are for safety reasons to keep the RS-coils connected to the cooling water circuit and to the electrical power supply, and for comfort to be possible by a single user in a short time. The user should be kept safe when changing between both operating modes, i.e., when extracting the RS-coils from the apparatus; the connections need to be maintained in an insulated manner.

The state-of-the-art for EPR is an apparatus for a single use only, equipped either with an EPR probe head adapted for RS measurements or with an EPR probe head adapted for CW signal measurements.

FIG. 7 shows schematically the main components of an EPR apparatus adapted for RS measurements as described in EP19315067.9. Such a known EPR apparatus 9 comprises a main magnet 10 with two opposed pole pieces 11 defining an air gap between them, an EPR probe head adapted for RS measurements, positioned between the pole pieces 11 of the main magnet 10 and a pair of RS coils 1. The EPR probe head of the EPR apparatus comprises a microwave resonator 12 coupled with a microwave guide 14 and a sample holder 13 for holding a sample to be analyzed. The EPR apparatus further comprises a current source 1" adapted to be used as a coil driver for the RS coils 1 and connected thereto by power supply lines 16.

During operation, the RS coils 1 may be cooled with a cooling fluid, in particular water, fed to the coils 1 via feed lines 7 (not entirely shown in the figures) from a cooling unit 7'. Preferably, the cooling unit 7' and the feed lines 7 may be sized and configured such that the surface temperature of the coil devices 1 does not exceed about 35° C.

SUMMARY OF THE INVENTION

The present invention provides a way to substantially overcome one or more disadvantages and trade-offs of the above discussed existing devices. One aspect of the present invention is to provide a combined CW-RS EPR device which is equipped with a mechanism allowing a quick and secure change of the RS-coils. Another aspect of the present invention is to encompass a positioning device so that a single user can safely and rapidly mount and lock the coils in their operating position.

According to the present invention, these objectives are achieved by an EPR apparatus that comprises at least one EPR probe head adapted for CW signal measurements, positioned between the pole pieces of the main magnet, and a carrier which allows insertion of the RS-coils into the air gap between the pole pieces of the magnet in an operation position and to extract the RS-coils from the air gap to a storage position outside of CW operating volume.

In this newly developed RS accessory with dedicated coil set, it is now possible to measure an RS signal on a CW upgraded spectrometer. These two spectroscopic methods (RS and CW) are complementary and have each their own advantages. Therefore, the user may want to switch rapidly from one mode to another several times per day. In terms of instrumentation, the major differences between CW and RS are in the rapid scan coils, in the driver, in the detector bandwidth and in the fast digitizer. In particular, the RS coils are physical devices which need to be replaced when changing from one mode to another. In CW mode, the user must ensure that the unused RS-coils are stored safely outside the field of view to prevent any damage. Currently, the change from one mode to another is quite long, requiring two operators in a confined space to handle the fragile RS-coils, and the operators must interact with a high voltage and water-cooling environment.

The present invention provides an apparatus which allows two functions: 1) storing the RS-coils in the back side of the spectrometer when unused without disconnecting electrical or water connections (the storage position must be such that the CW operations are unaffected by the RS-coils); and 2) acting as a positioning device for installation of coils in RS mode so that a single user can safely and rapidly mount and lock the coils on their operating position. In addition, in RS mode, the apparatus is unused and must be easily accessible for the next switch from RS to CW mode.

To achieve these two functions, the proposed design of the carrier is based on a sliding or pivoting mechanism attached to the magnet. At the front of this apparatus, a dedicated mechanical support is provided to hold and to move axially the coils from the operating position (larger gap coil-coil) to the compact storage position (smaller gap to avoid mechanical interference with spectrometer). Rigid and lightweight material is used for precise positioning, and the material may be non-magnetic as well.

In an exemplary embodiment of the present invention, the at least one EPR probe head is a single probe head adapted for both RS measurements and CW signal measurements, thereby taking special advantage of the EPR apparatus according to the invention. The probe head comprises generally an EPR resonator, a sample holder and a microwave guide.

In an alternative embodiment of the invention, instead of a single probe head, a set of several different EPR probe heads adapted for RS measurements or for CW signal measurements is held in stock. The different probe heads are adapted for specific measurements. It should be noted, however, that for this embodiment it is required that the RS probe head and the CW probe head are connected via the microwave guide to the same front end module. Moreover, it is possible that the RS probe head and the RS-coils are arranged both on the carrier and these parts are inserted and extracted simultaneously.

In practical applications of the invention, the carrier is made of non-magnetic material, preferably plastic, fiberglass or aluminum, thereby avoiding any disturbances of the magnetic field used in the EPR apparatus.

In an exemplary class of embodiments of the invention, the carrier comprises:

a mounting for rigidly attaching the carrier to the EPR-apparatus mechanical structure, an elongated spacer which is arranged to the mounting and which extends into the air gap with its distal end, a holder arranged at the distal end of the spacer for attaching and detaching the RS-coils, and a pivot and/or sliding mechanism arranged on the mounting for moving the spacer with the holder between a storage position and an operating position.

In a first variant of this class of embodiments, the holder comprises a fixing plate to which both RS-coils are attached at a predefined position spaced apart from each other. The fixing plate comprises attaching means for securing the RS-coils to the fixing plate during the movement of the carrier. Attachment means for securing the coils during the transport between the operating and the storage position can be, for instance, screws and/or a clip and/or a hook. In any case is it necessary to protect the brittle ceramic body of the coils.

In a second (complementary or supplementary) variant of this class of embodiments, the holder comprises a brace to keep both coils spaced apart from each other.

In a preferred further modification, the predefined spaced apart position of the RS-coils corresponds to the distance of the pole pieces to which the coils are fixed. This allows the direct insertion of the coils to the pole pieces to the abutment surface of the pole pieces in a single movement. Otherwise, the RS-coils need to be positioned by the user in a separate movement. For this option, a handle is useful.

In another embodiment of the invention, the RS-coils are equipped with an adjustment device allowing for adjustment of the position of the RS-coils, in particular of the coil air gap, while attached to the carrier, so that they won't interfere with the mounting jaws when sliding the RS-coils in storage position.

In still another embodiment of the invention, the pole pieces are equipped with a fixing device for positioning the RS-coils precisely, in particular with an abutment surface, or with centering devices such as pins or clamping jaws. Thereby a user can fix the RS-coils, e.g., with screws, for avoiding disassociation caused by the vibrations of the RS-coils, to the pole piece at a predefined position inside the air gap.

In a further embodiment of the invention, the pole pieces are equipped with a device for releasably fixing the RS-coils by force-fit. RS-coils are subject to important vibrations during operation. To avoid any movement or even unfastening of the RS-coils, the RS-coils need to be rigidly fixed to the pole pieces. In one embodiment, a knurled screw is used for the operator being capable to apply a force necessary to ensure a force-fit of the coil to the pole piece.

A further class of embodiments of the invention is characterized in that the RS-coils have supply lines, in particular for a power supply, which are made of flexible material for allowing the user to move the RS-coils without buckling off the feed lines. In a particular variant of this class of embodiments, the supply lines of the RS coils comprise a feeder with two spaced apart feeding wires, which are preferably twisted for preventing electromagnetic compatibility issues.

In further favorable embodiments of the EPR apparatus according to the invention, the supply lines of the RS-coils comprise a feed line for cooling water which is arranged separately, preferably below the EPR apparatus to avoid water pouring in electric devices in case of cooling water leakage. In operation, the RS-coils generate heat, which must be dissipated.

For most implementations, the EPR apparatus according to the present invention is equipped with a device for automated or semi-automated sequential switching between RS and CW mode, in particular by using an electric motorization or a hydraulic or a pneumatic power unit.

BRIEF DESCRIPTION OF THE DRAWINGS

These, as well as other objects and advantages of this invention can be better understood and appreciated through careful study of the following detailed description of presently preferred exemplary embodiments of this invention in conjunction with the accompanying drawings. In order to make the aforesaid and other features and advantages of the present invention more apparent to those skilled in the art, exemplary embodiments of the present invention will be described in detail below by referring to the following drawings, wherein identical numerals represent the same parts.

FIG. 5c shows an embodiment of the carrier in accordance with FIG. 5a.

FIG. 6 shows a schematic perspective view of an embodiment of the EPR apparatus with the RS-coils attached to the magnet, the carrier being retracted and the probe head comprising a microwave resonator inserted between the RS-coils for operating in RS mode.

FIG. 7 shows a schematic drawing of the main components an EPR apparatus according to prior art.

DETAILED DESCRIPTION

In contrast with the prior art, the present invention provides an EPR apparatus with a combination of two possible operation modes, namely, RS measurements and CW signal measurements. For this purpose, the EPR apparatus according to the present invention, in addition to the known single use devices, comprises at least one EPR probe head adapted for CW signal measurements, positioned between the pole pieces 11 of the main magnet 10, and a carrier 20 which allows insertion of the RS coils 1 into the air gap between the pole pieces 11 of the magnet 10 in an operation position and extraction of the RS-coils 1 from the air gap to a storage position outside of CW operating volume.

In embodiments of the EPR apparatus according to the invention, the at least one EPR probe head is a single probe head adapted for both, RS measurements and CW signal measurements. In alternative embodiments, a set of several different EPR probe heads adapted for RS measurements or for CW signal measurements is held in stock.

In the following, the invention is further explained and discussed in detail by way of examples and with reference to FIGS. 1 through 6 depicting details of the invention.

Figure 1:
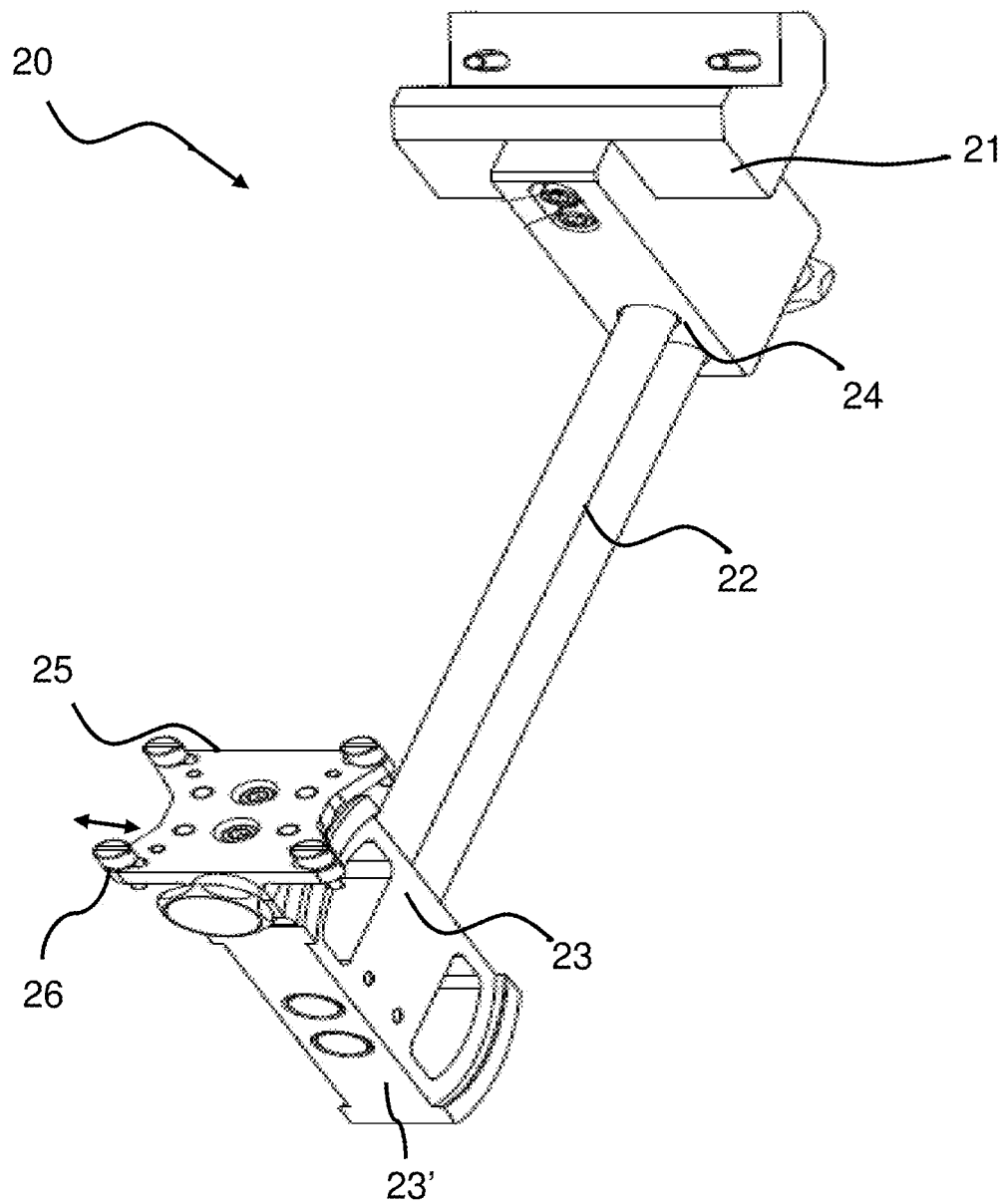
FIG. 1 shows a schematic perspective view of an embodiment of the carrier for the RS-coils.

FIG. 1 shows important details of an embodiment of the carrier 20 for the RS-coils 1, the carrier comprising:

a mounting 21 for rigidly attaching the carrier 20 to the EPR-apparatus mechanical structure, an elongated spacer 22 which is movably connected to the mounting 21 and which has a distal end that can be extended into the air gap, a holder 23 located at the distal end of the spacer for attaching and detaching the RS-coils, and a movement mechanism 24 arranged on the mounting 21 for enabling movement of the spacer 22 with the holder 23 between a storage position and an operating position.

In the carrier 20 of FIG. 1, the holder 23 further comprises a brace 23' to keep both coils 1 spaced apart from each other. This brace 23' is also shown in greater detail in FIGS. 3b and 5a-5c. Furthermore, the holder 23 comprises a fixing plate 25 to which both RS-coils 1 are attached at a predefined position spaced apart from each other. In addition, the RS-coils 1 are equipped with an adjustment device 26 allowing for adjustment of the position of the RS-coils 1, while attached to the carrier 20. The adjustment device 26 is constructed such that fixing screws are each guided in a slot so as to relocate the RS-coils 1 from a compact "parking" position at the fixing plate 25 towards the pole pieces 11. The double arrow in FIG. 1 indicates the possibility of linearly moving the plate 25 relative to said screws in the same direction back and forth.

Figure 2A:
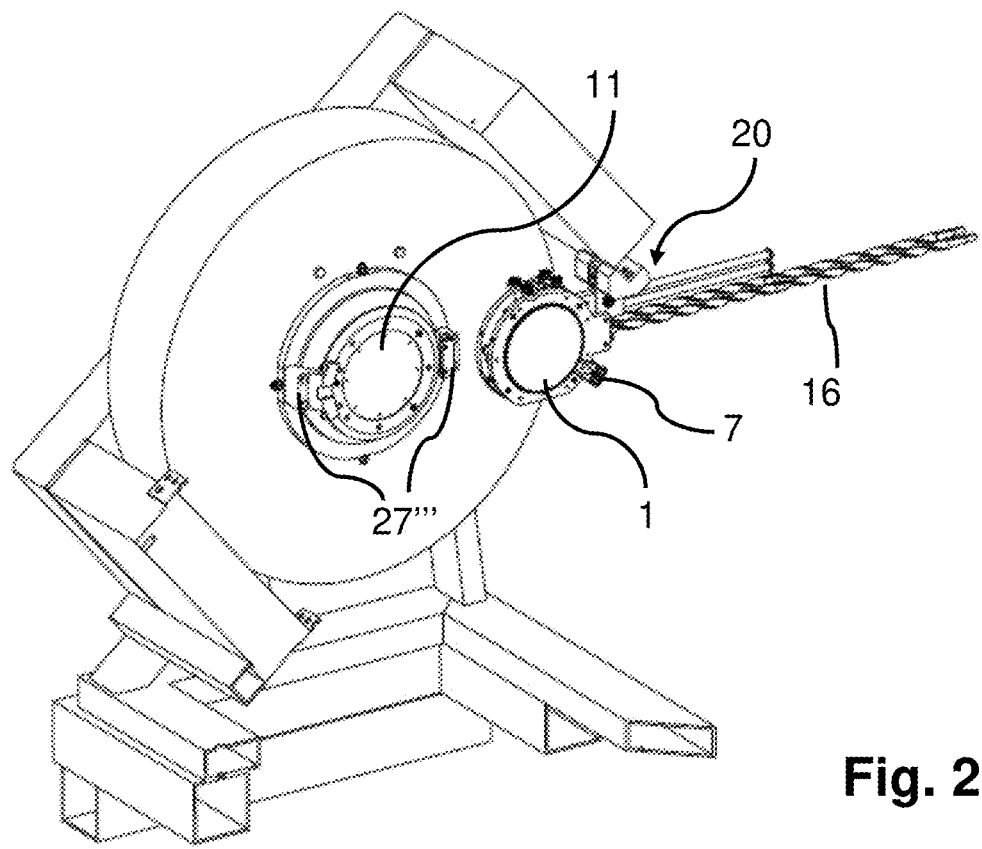
FIG. 2a shows a schematic perspective view of an embodiment of the EPR apparatus with the RS coils attached to the carrier in compact storage position (CW mode).
Figure 2B:
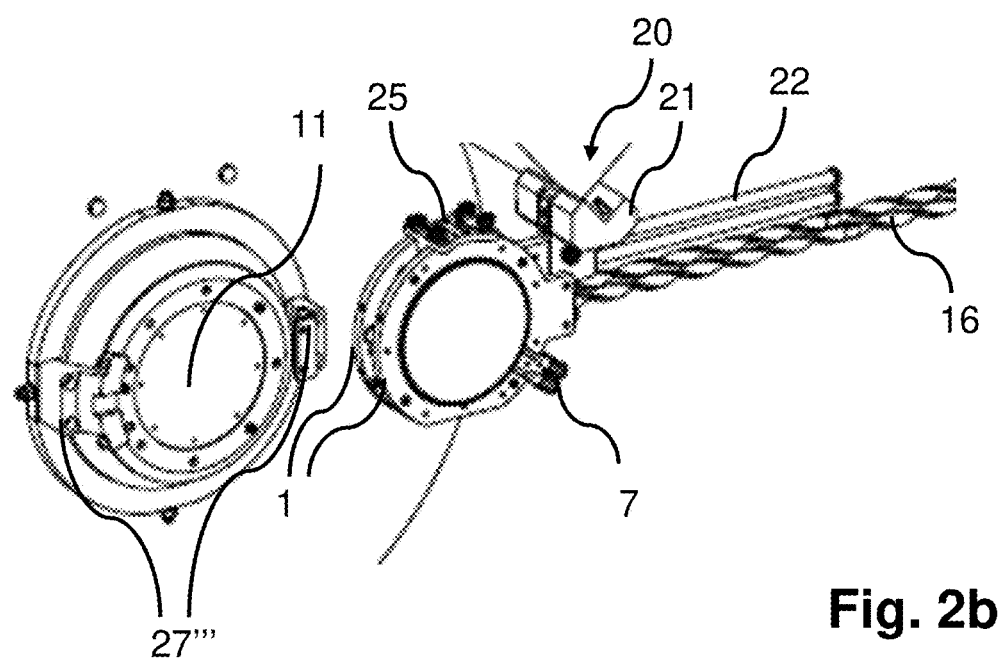
FIG. 2b shows an extract of the EPR apparatus according to FIG. 2a in greater detail, in particular the clamping jaws clamping the RS-coils to the pole piece.

FIGS. 2a and 2b show the RS coils 1 attached to the carrier 20 in a compact storage position (CW mode), wherein clamping jaws 27''' are visible in the release position with the RS-coils 1 being detached from the pole piece 11.

Figure 3A:
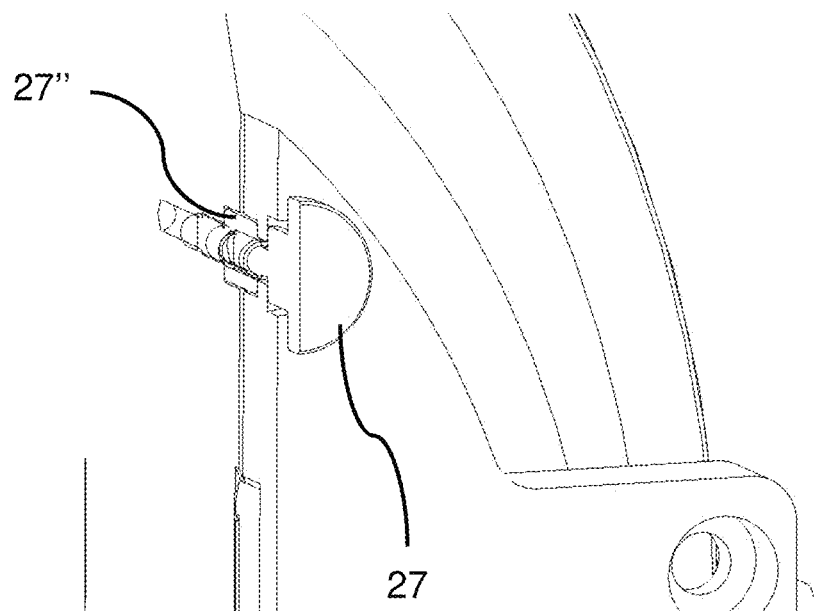
FIG. 3a shows a sectional drawing of a part of the RS-coil mounted to the pole piece.
Figure 3B:
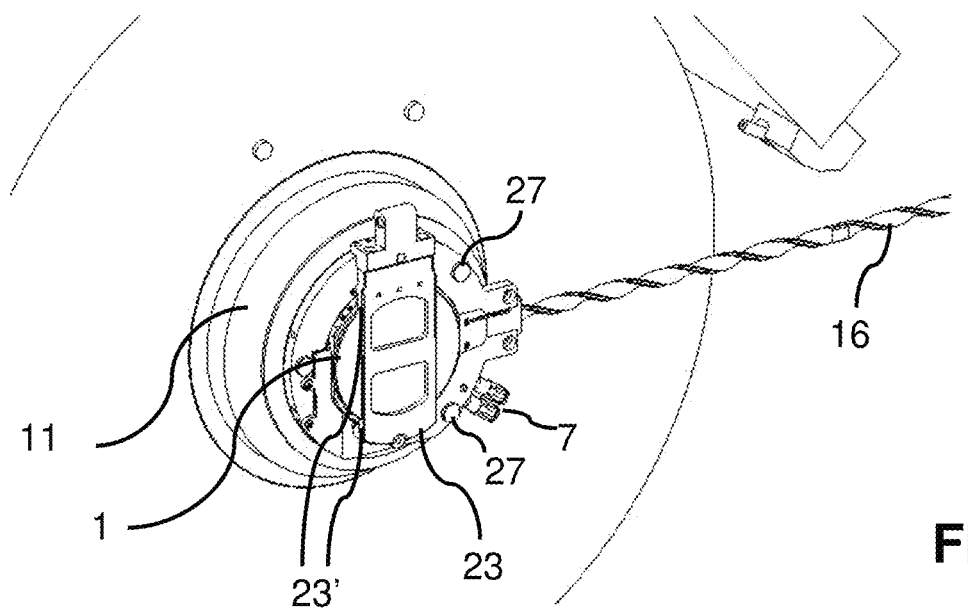
FIG. 3b shows a front view of the RS-coil mounted to the pole piece (spacer not shown).

As an alternative fixing, FIGS. 3a and 3b show an embodiment where the pole pieces 11 are equipped with a fixing device 27 for positioning the RS-coils 1 precisely, in particular with centering devices such as pins 27'' as an alternative to the clamping jaws 27''' shown in FIG. 2b. The pole piece 11 is provided with these protruding permanently mounted pins 27'' allowing the centering of the RS-coil 1 to the pole piece 11 before fixing them to the pole piece 11 by screws, for example.

The sectional drawing of FIG. 3a shows the pins 27'' being mounted to the pole piece 11. These pins 27'' serve as centering devices and attachment for the screws.

FIG. 3b shows a pole piece 11 to which an RS-coil 1 is mounted. The holder 23 is still attached to the RS-coil 1. In this embodiment, the holder 23 is equipped with a handle that allows the user to position the RS-coil 1 with one hand while screwing the RS-coil 1 to the pole piece 11 with the other hand. A brace 23' keeps both coils 1 spaced apart from each other.

Figure 4A:
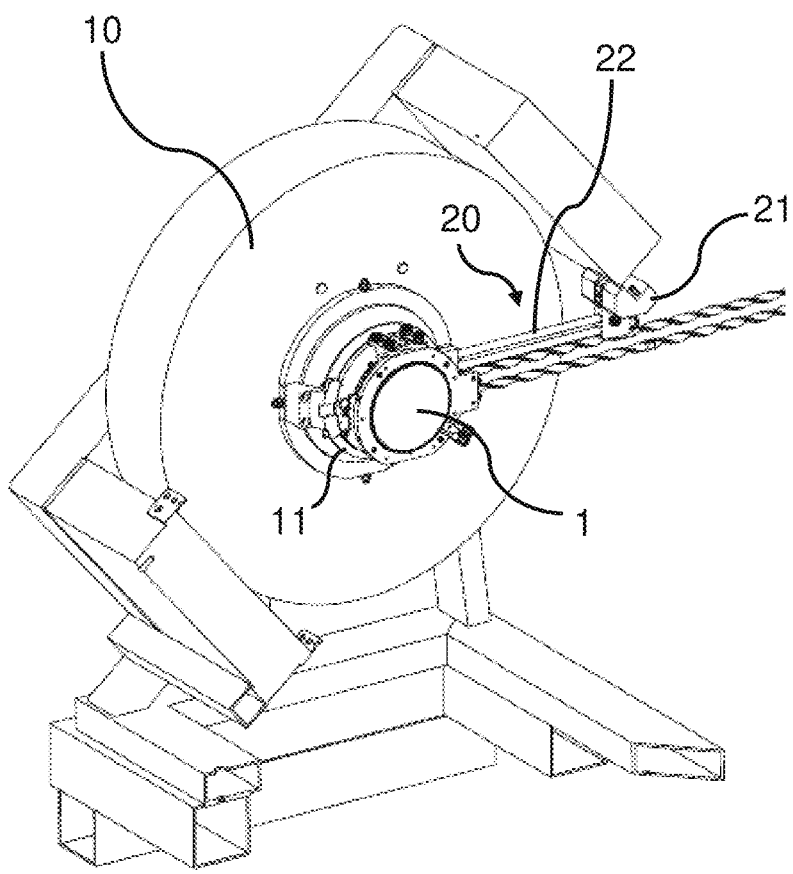
FIG. 4a shows a schematic perspective view of the embodiment according to FIG. 2a with the RS-coils still attached to the to the carrier in the magnet air gap, the carrier and the RS-coils being in intermediate position with the carrier being extended so that the RS coil can be attached or detached from magnet pole pieces.

FIG. 4a shows the embodiment according to FIG. 2a with the RS-coils 1 still attached to the carrier 20 in the magnet air gap, the carrier 20 with the mounting 21 and the spacer 22 being in intermediate position between CW mode and RS mode with the RS-coils being positioned with the carrier 20 in the air gap. It should be noted that, in operation (CW or RS), the carrier 20 is always retracted. The carrier 20 is only extended when attaching or removing the RS-coils 1 from the magnet pole pieces 11.

Figure 4B:
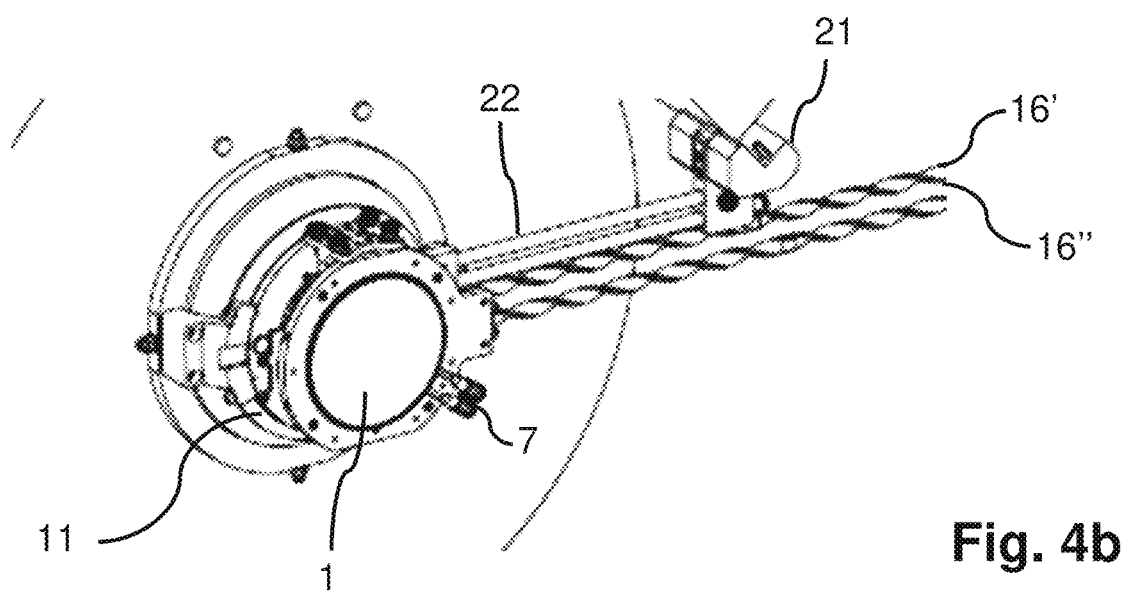
FIG. 4b shows an extract of the EPR apparatus according to FIG. 4a in greater detail.

FIG. 4b shows in greater detail the power supply lines 16 of the RS-coils 1 comprising two pairs of spaced apart feeding wires 16', 16" which are preferably helical or twisted for preventing electromagnetic compatibility issues. The power supply lines 16 electrically connect the RS-coils 1 with a current source 1" (not shown in this figure) and are made of flexible material.

Figure 5A:
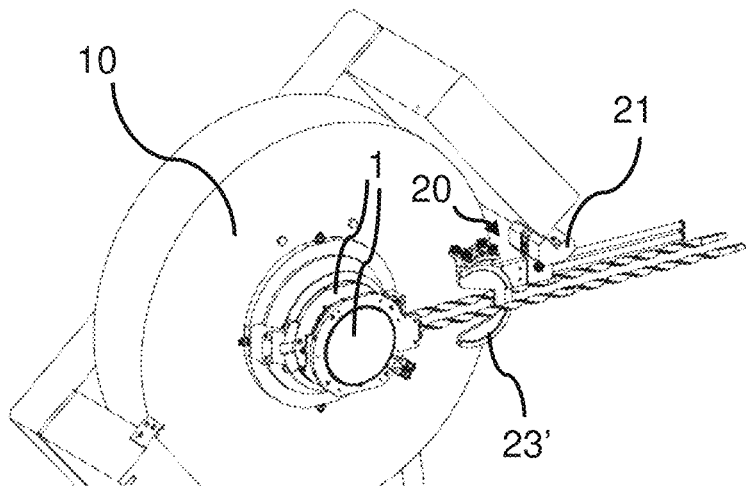
FIG. 5a shows a schematic perspective view of the embodiment according to FIG. 4a with the RS coils attached to the magnet, the carrier being retracted to operate in RS mode.

FIG. 5a shows the embodiment of FIG. 4a with the RS-coils 1 attached to the magnet 10, with the carrier 20 being retracted and ready to operate in RS mode. It is necessary to retract the carrier 20 during operation, because the microwave resonator 12 needs to be inserted between the RS-coils 1 (as shown in FIG. 6 below).

Figure 5C:
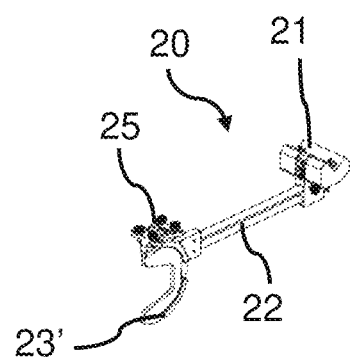
Figure 5B:
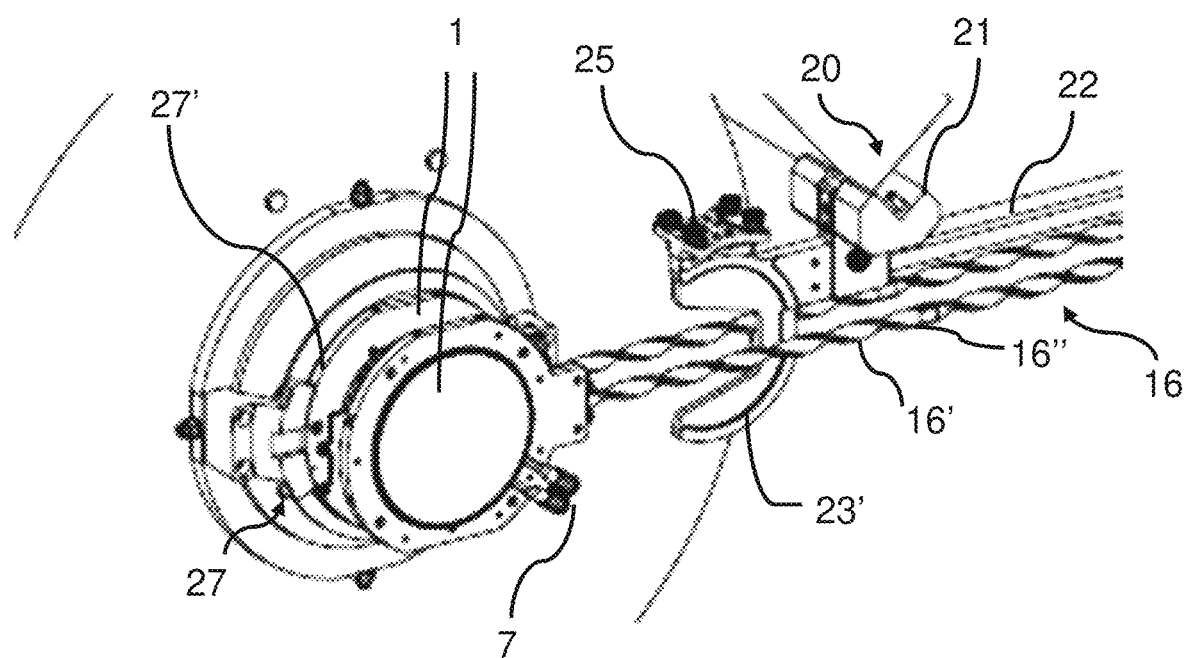
FIG. 5b shows an extract of the EPR apparatus according to FIG. 5a in greater detail.

FIG. 5b shows in greater detail the embodiment of the carrier 20 in accordance with FIG. 5a, wherein a fixing device 27 for positioning the RS-coils 1 precisely is equipped with an abutment surface 27'. For maintaining linear impedance at high frequency (minimization of parasitic capacitors), the power supply line 16 of each coil device 1 again comprises two spaced apart feeding wires 16', 16" which are composed of electrical wires twisted around each other.

FIG. 5c shows the carrier 20 with the holder 23 according to FIG. 5a in greater detail having a brace 23'.

FIG. 6 shows the EPR apparatus according to the invention with the RS coils attached to the magnet 10, the carrier 20 being retracted and the probe head (comprising a microwave resonator, a microwave guide and a sample holder as known in the prior art) inserted between the RS-coils for operating in RS mode. The carrier 20 is equipped with a device 28 for automated or semi-automated sequential switching between RS and CW mode, in particular by using an electric motorization or a hydraulic or a pneumatic power unit (not shown in the drawings). Alternative options are other sliding solutions or alternative mechanical movement, e.g., rotational motion.

The present invention provides for fast switching of the RS-coil position between RS and CW EPR modes by single user in a very confined space, as a user may want to switch from RS to CW several times a day. It avoids the need for user intervention with regard to electrical and/or cooling connections to ensure operator safety (particularly in light of high voltages) and component integrity (permanent connections are used). The invention also allows standard operating access for the EPR spectrometer while limiting user handling of RS-coils (which may comprise fragile ceramic material). The system also ensures safe storage when the RS-coils are unused, as they remain mounted on the magnet.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. An electron paramagnetic resonance (EPR) apparatus comprising:
    a main magnet with two pole pieces provided on either side of an air gap;
    at least one EPR probe head adapted for rapid scan (RS) measurements positioned between the pole pieces of the main magnet;
    a pair of RS coils;
    at least one EPR probe head adapted for Continuous Wave (CW) signal measurements, positioned between the pole pieces of the main magnet; and
    a carrier which allows insertion of the RS coils into the air gap between the pole pieces of the magnet in an operation position and extraction of the RS coils from the air gap to a storage position outside of a CW operating volume, the carrier being retractable from the air gap while the RS coils remain in the air gap between the pole pieces.

2. An EPR apparatus according to claim 1, wherein the at least one EPR probe head adapted for RS measurements and the at least one EPR probe head adapted for CW signal measurements are the same EPR probe head.

3. An EPR apparatus according to claim 1, wherein the at least one EPR probe head adapted for RS measurements and the at least one EPR probe head adapted for CW signal measurements are different EPR probe heads.

4. An EPR apparatus according to claim 1, wherein the carrier is made of non-magnetic material.

5. An EPR apparatus according to claim 1, wherein the carrier further comprises:
    a mounting for rigidly attaching the carrier to a mechanical structure of the EPR apparatus;
    an elongated spacer which is movably connected to the mounting and which has a distal end which extends into the air gap;
    a holder located at the distal end of the spacer for attaching and detaching the RS coils; and
    a movement mechanism arranged on the mounting for enabling movement of the spacer with the holder between the storage position and an operating position.

6. An EPR apparatus according to claim 5, wherein the holder comprises a fixing plate to which the RS coils are attached at a predefined position spaced apart from each other.

7. An EPR apparatus according to claim 5, wherein the holder comprises a brace that keeps the RS coils spaced apart from each other.

8. An EPR apparatus according to claim 1, wherein the RS coils are equipped with an adjustment device for adjusting the position of the RS coils while attached to the carrier.

9. An EPR apparatus according to claim 1, wherein the pole pieces are equipped with a fixing device for positioning the RS coils precisely relative thereto.

10. An EPR apparatus according to claim 9, wherein the fixing device comprises at least one of an abutment surface and one or more centering devices.

11. An EPR apparatus according to claim 10, wherein the one or more centering devices comprise one of pins or clamping jaws.

12. An EPR apparatus according to claim 1, wherein the pole pieces are equipped with a device for releasably fixing the RS coils thereto by force-fit.

13. An EPR apparatus according to claim 1, wherein the RS coils comprise power supply lines made of flexible material.

14. An EPR apparatus according to claim 13, wherein the power supply lines comprise two spaced apart feeding wires that are twisted about each other.

15. An EPR apparatus according to claim 1, wherein the RS coils comprise a feed line for cooling water.

16. An EPR apparatus according to claim 1, wherein the carrier is equipped with a device for automated or semi-automated sequential switching between RS and CW mode.

* * * * *